(12) United States Patent
Kakkad et al.

(10) Patent No.: US 8,045,082 B2
(45) Date of Patent: Oct. 25, 2011

(54) SYSTEM FOR DISPLAY IMAGES AND FABRICATION METHOD THEREOF

(75) Inventors: Ramesh Kakkad, Hsinchu (TW);
Hsiao-Wei Kao, Taipei (TW);
Chung-Sheng Lin, Taipei (TW);
Chih-Chung Liu, Hsinchu (TW)

(73) Assignee: Chimei Innolux Corporation, Miao-Li County (TW)

( * ) Notice: Subject to any disclaimer, the term of this patent is extended or adjusted under 35 U.S.C. 154(b) by 535 days.

(21) Appl. No.: 12/052,197

(22) Filed: Mar. 20, 2008

(65) Prior Publication Data

US 2009/0237580 A1  Sep. 24, 2009

(51) Int. Cl.
*G02F 1/136* (2006.01)
(52) U.S. Cl. ............................... 349/46; 349/47
(58) Field of Classification Search ............... 349/46–47
See application file for complete search history.

(56) References Cited

U.S. PATENT DOCUMENTS

| | | | | |
|---|---|---|---|---|
| 5,767,930 A | * | 6/1998 | Kobayashi et al. | 349/42 |
| 7,423,712 B2 | * | 9/2008 | Jeoung et al. | 349/114 |
| 2005/0078242 A1 | * | 4/2005 | Park et al. | 349/113 |
| 2007/0291193 A1 | * | 12/2007 | Cheng | 349/43 |

* cited by examiner

*Primary Examiner* — Phu Vu
(74) *Attorney, Agent, or Firm* — Morris Manning Martin LLP; Tim Tingkang Xia, Esq.

(57) ABSTRACT

A system for display images comprising a thin film transistor array substrate is disclosed. The system for display images comprises a substrate having a pixel area, a source/drain region overlying the substrate within an active layer in the pixel area, a bottom electrode overlying the substrate in the pixel area, a top electrode overlying the bottom electrode, a first dielectric layer disposed on the active layer, a second dielectric layer disposed on the first dielectric layer, wherein the second dielectric layer is disposed between the bottom electrode and the top electrode and a gate disposed overlying the active layer, wherein the first and second dielectric layers are interposed between the gate and the active layer.

18 Claims, 11 Drawing Sheets

SYSTEM FOR DISPLAY IMAGES AND FABRICATION METHOD THEREOF

BACKGROUND OF THE INVENTION

1. Field of the Invention

The present invention relates to a system for display images including thin film transistor (TFT) liquid crystal display (LCD), and more particularly relates to a TFT array substrate.

2. Description of the Related Art

Generally, a liquid crystal display (LCD) comprises a lower substrate, an upper substrate and a liquid crystal layer interposed therebetween. The upper substrate typically comprises a color filter and a common electrode. The lower substrate typically comprises a plurality of pixel areas defined by crossing gate lines and source lines (or data lines). Each pixel area comprises a thin film transistor serving as a switching element located near the intersection of the gate and source lines and a pixel electrode electrically connected to the thin film transistor. The thin film transistor comprises a gate, a source and a drain, wherein the gate is typically an extended portion of the gate line and the drain is electrically connected to the pixel electrode via a contact hole. The liquid crystal layer interposed between the common electrode and the pixel electrode forms a capacity of liquid crystal.

In order to improve image quality, a storage capacitor is formed in each pixel area. FIG. 1 shows the essential components of a TFT array substrate used in a conventional thin film transistor liquid crystal display (TFT-LCD). Typically, the formation process of the structure shown in FIG. 1 includes the following steps: forming a first active layer 2a, a second active layer 2b in a driver area 16, a third active layer 2c and a bottom electrode 2d in a pixel area 22; performing an implantation to form source/drain regions 5 in the first active layer 2a of the driver area 16, source/drain regions 15 in the third active layer 2c of the pixel area 22 and an n+ type doped bottom electrode 2d in the pixel area 22; depositing a first gate dielectric layer 3 covering the first active layer 2a, the second active layer 2b, the third active layer 2c and the bottom electrode 2d; depositing a second gate dielectric layer 7 on the first gate dielectric layer 3; and forming a first gate 6, a second gate 8, a third gate 10, and a top electrode 14 overlying the second gate dielectric layer 7 of the first active layer 2a, the second active layer 2b, the third active layer 2c and the bottom electrode 2d.

Nevertheless, the conventional LCD has some technological issues. For example, since the storage capacitor is opaque, the aperture ratio of a pixel is reduced resulting inferior pixel quality. Additionally, since the dielectric layers of the capacitors (gate capacitor and storage capacitor) are made from the same material and are of same thickness, the capacitance value per unit area for the gate capacitor and storage capacitor is same. Thus, the capacitance of the gate capacitors and storage capacitors can not be independently controlled and the value of storage capacitance per unit area is dependent on the thickness requirements of the gate dielectric. Moreover, the method hinders thinning of the dielectric layer.

What is needed, therefore, is a TFT array substrate with a storage capacitor having a thinner dielectric layer for a TFT-LCD.

BRIEF SUMMARY OF THE INVENTION

A detailed description is given in the following embodiments with reference to the accompanying drawings.

An embodiment of the invention provides a system for display images comprising a thin film transistor array substrate. The system for display images comprises a substrate having a pixel area, a source/drain region overlying the substrate within an active layer in the pixel area, a bottom electrode overlying the substrate in the pixel area, a top electrode overlying the bottom electrode, a first dielectric layer disposed on the active layer, a second dielectric layer disposed on the first dielectric layer, wherein the second dielectric layer is disposed between the bottom electrode and the top electrode and a gate disposed overlying the active layer, wherein the first and second dielectric layers are interposed between the gate and the active layer.

Another embodiment of the invention providing a method of forming a system for display images, comprising forming a thin film transistor array substrate. First, a substrate having a pixel area is provided. A semiconductor layer is formed on the substrate in the pixel area. The semiconductor layer is patterned to form an active layer and a bottom electrode in the pixel area. A first dielectric layer is formed on the active layer and the bottom electrode. A mask is formed on the first dielectric layer above the active layer. the first dielectric layer is partially removed to expose the bottom electrode or leave a thinner portion of the first dielectric layer on the bottom electrode. Ions are implanted into the active layer to form a source/drain region. A second dielectric layer is formed on the first dielectric layer and the bottom electrode. A metal layer is formed on the second dielectric layer. The metal layer is patterned to form a gate and a top electrode above the active layer and the bottom electrode respectively.

BRIEF DESCRIPTION OF THE DRAWINGS

The present invention can be more fully understood by reading the subsequent detailed description and examples with references made to the accompanying drawings, wherein:

FIGS. 2 through 9 are cross-sectional views of intermediate stages in the manufacturing of a TFT array substrate in accordance with an embodiment of the invention.

DETAILED DESCRIPTION OF THE INVENTION

Figure 1:
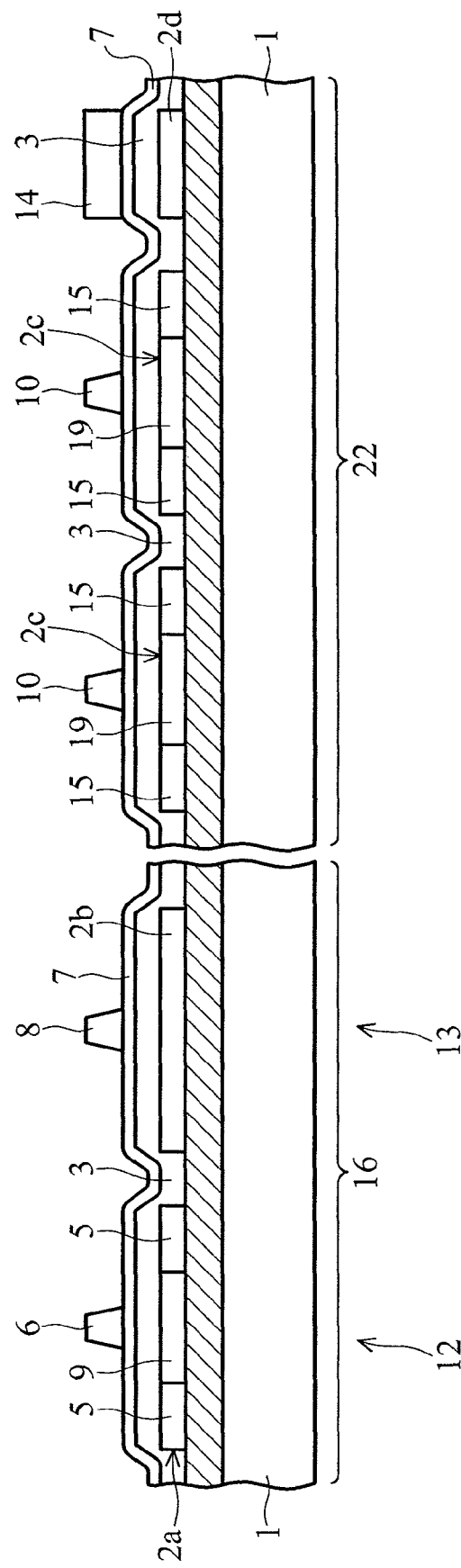
FIG. 1 shows a conventional TFT array substrate of a TFT-LCD.

The following description is of the best-contemplated mode of carrying out the invention. This description is made for the purpose of illustrating the general principles of the invention and should not be taken in a limiting sense. The scope of the invention is best determined by reference to the appended claims.

The invention will be described in greater detail by referring to the accompanying drawings. In the accompanying drawings, like corresponding elements are referred to by respective like reference numerals.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers.

A novel method for forming TFT array substrates of a TFT-LCD is provided. The intermediate stages of manufacturing a liquid crystal display panel of an embodiment of the present invention are illustrated in FIGS. 2 through 8. Variations of the embodiments are then discussed.

Figure 2:
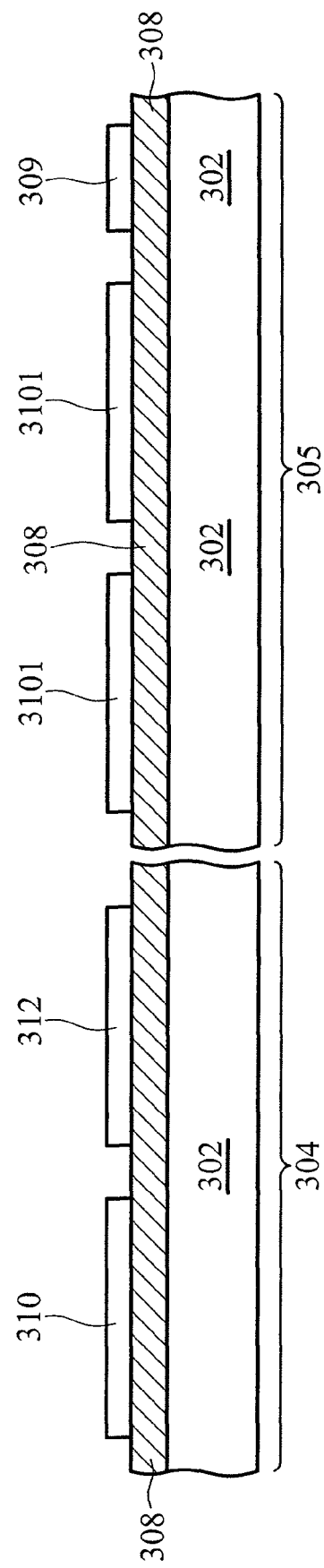

Referring to FIG. 2, a substrate 302 comprising a driver area 304 and a pixel area 305 is provided, and a buffer layer 308 is optionally formed on the substrate 302. In general, the buffer layer 308 may comprise silicon oxide, silicon nitride or a combination thereof, and can be a stack of a silicon oxide layer and a silicon nitride layer. According to various embodiments, thickness of the silicon nitride layer is about 200 Å-800 Å and thickness of the silicon oxide layer is about 500 Å-1500 Å.

Next, a semiconductor layer (not shown) is formed on the buffer layer 308. Typically, the semiconductor layer may comprise polysilicon. For example, an amorphous silicon layer is first formed by deposition with chemical vapor deposition (CVD) and then crystallized or annealed with excimer laser annealing (ELA) to form a polysilicon layer. The semiconductor layer is defined by conventional lithographic and etching techniques to form an active layer 310 and an active layer 312 overlying the driver area 304 of the substrate, an active layer 3101 and a bottom electrode 309 overlying the substrate 302 in the pixel area 305.

Figure 3:
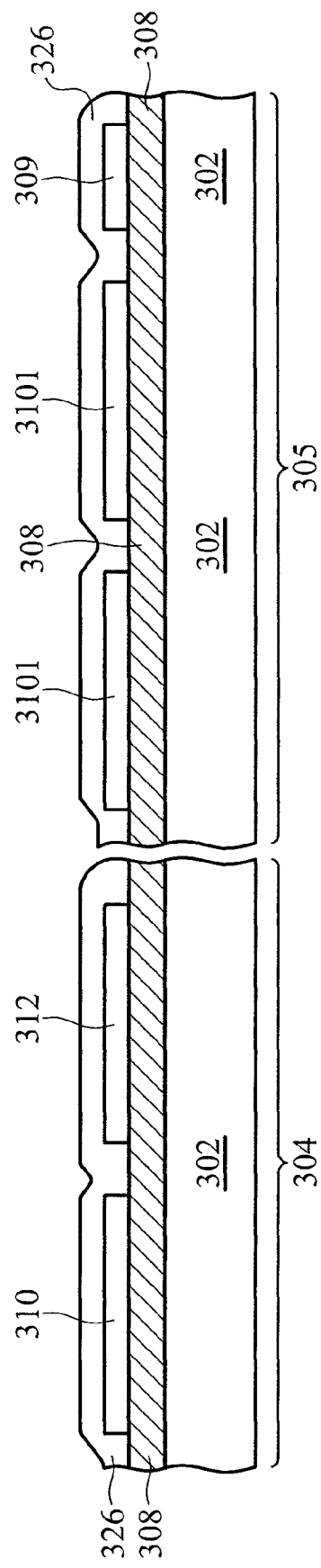

Referring to FIG. 3, a first dielectric layer 326, for example silicon oxide, is blanketly deposited on the active layer 310, the active layer 312, the active layer 3101, the buffer layer 308 and the bottom electrode 309. In an embodiment, deposition of the first dielectric layer 326 may comprise CVD.

Figure 4:
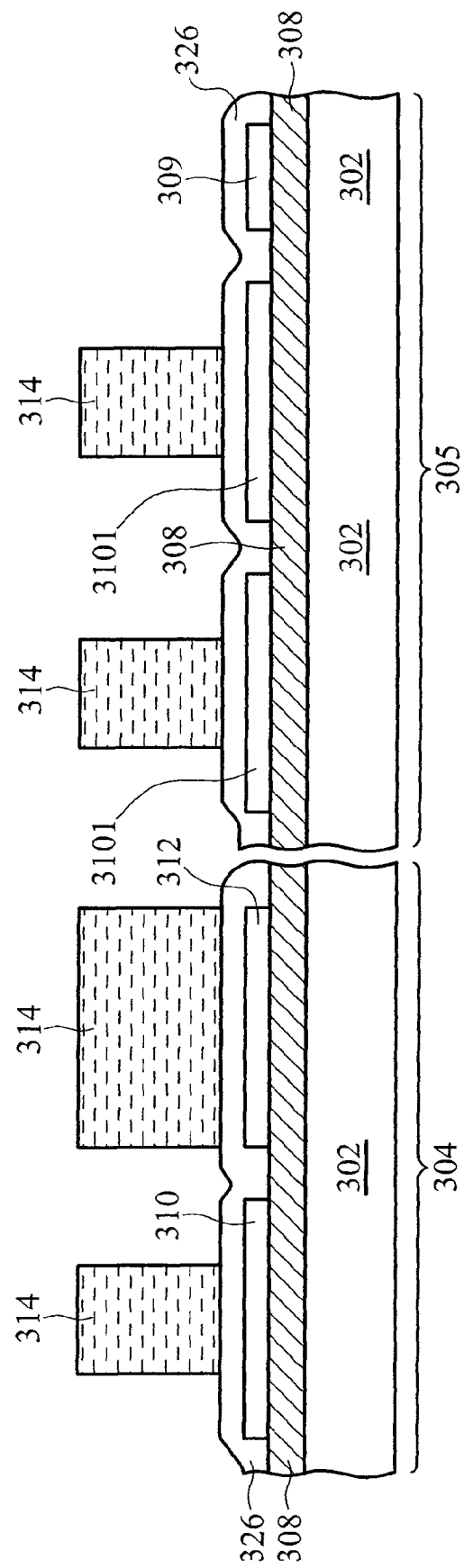
Figure 5A:
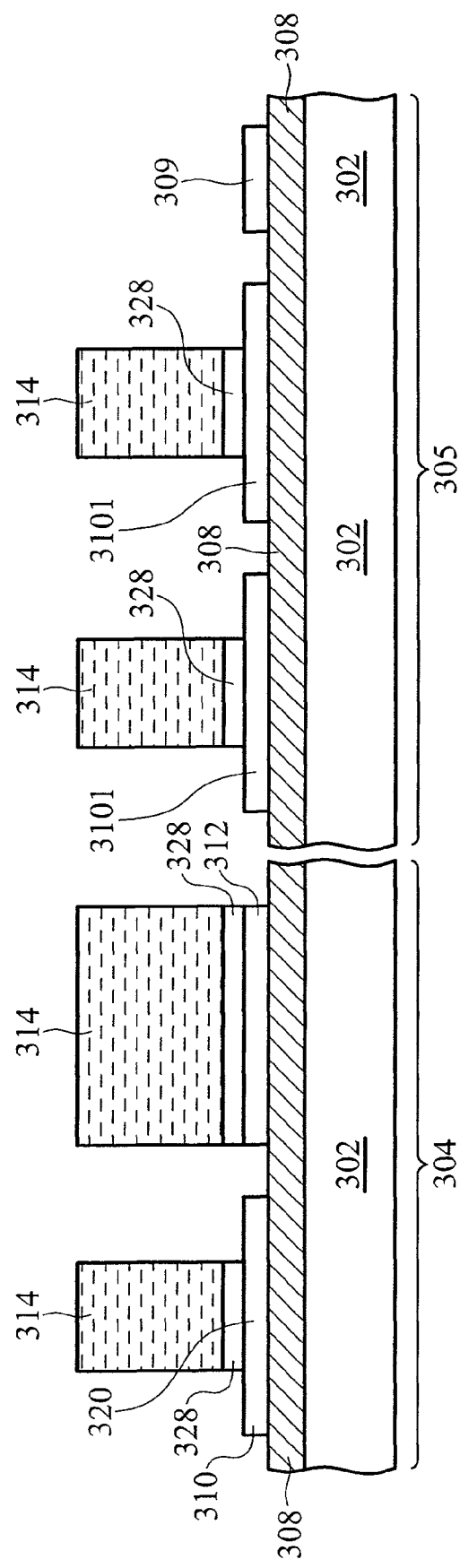
FIG. 5A illustrates a partially removing of the first dielectric layer in accordance with an embodiment of the invention.

FIGS. 4 and 5A illustrate a partially removing of the first dielectric layer 326, wherein the partially removing may be performed by either wet etching or dry etching. A photoresist layer 314 is formed on a portion of the first dielectric layer 326 serving as a mask layer. Then, an etching process to remove the first dielectric layer 326 not covered by the photoresist layer 314 is performed and thus a patterned first dielectric layer 328 is formed, as shown in FIG. 5A. After patterning the first dielectric layer 326, the bottom electrode 309, a portion of the active layer 310 and a portion of the active layer 3101 are thus exposed.

Figure 5B:
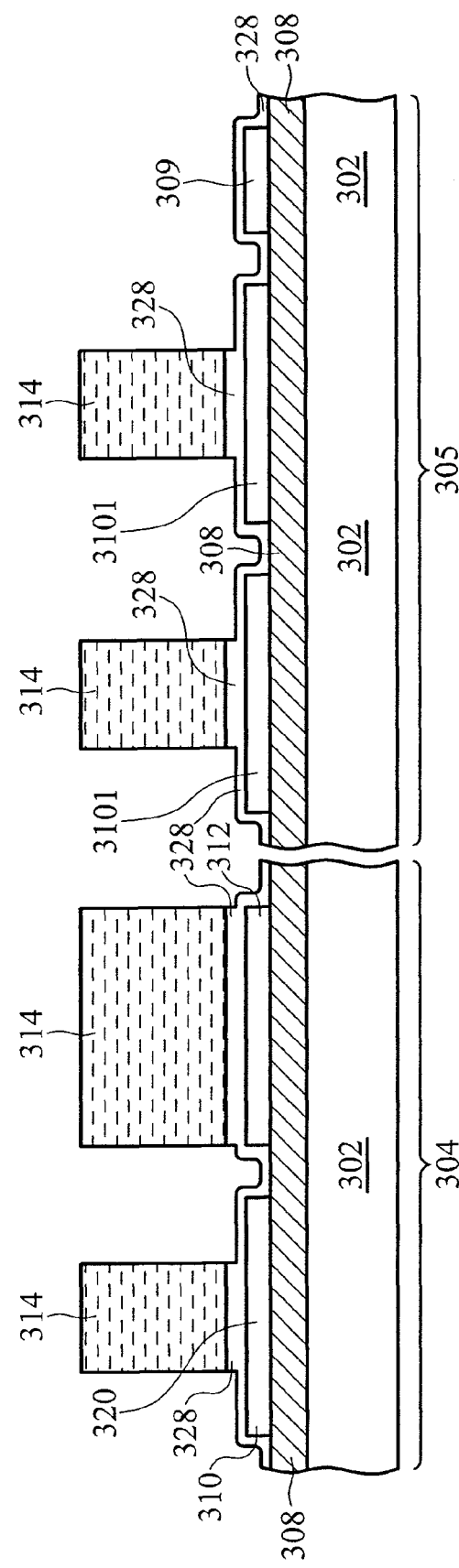
FIG. 5B shows a portion of thickness of the first dielectric layer can be remained in accordance with an alternative embodiment of the invention.

Continuing to FIG. 4 and referring to FIG. 5B, in an alternative embodiment, a portion of thickness of the first dielectric layer 326 not covered by the photoresist layer 314 can be remained by shortening etching time during etching in order to prevent the possible damage to the underlying features during subsequent processing. In an embodiment, the remaining thickness of the first dielectric layer 326 can be between about 0 Å and about 500 Å, preferably about 150 to 250 Å, more preferably about 200 Å. However, in this embodiment, thickness of the first dielectric layer 326 under the photoresist layer 314 is about 200-1000 Å. That is, a thinner portion of the first dielectric layer 328 extends on the bottom electrode 309.

Figure 6:
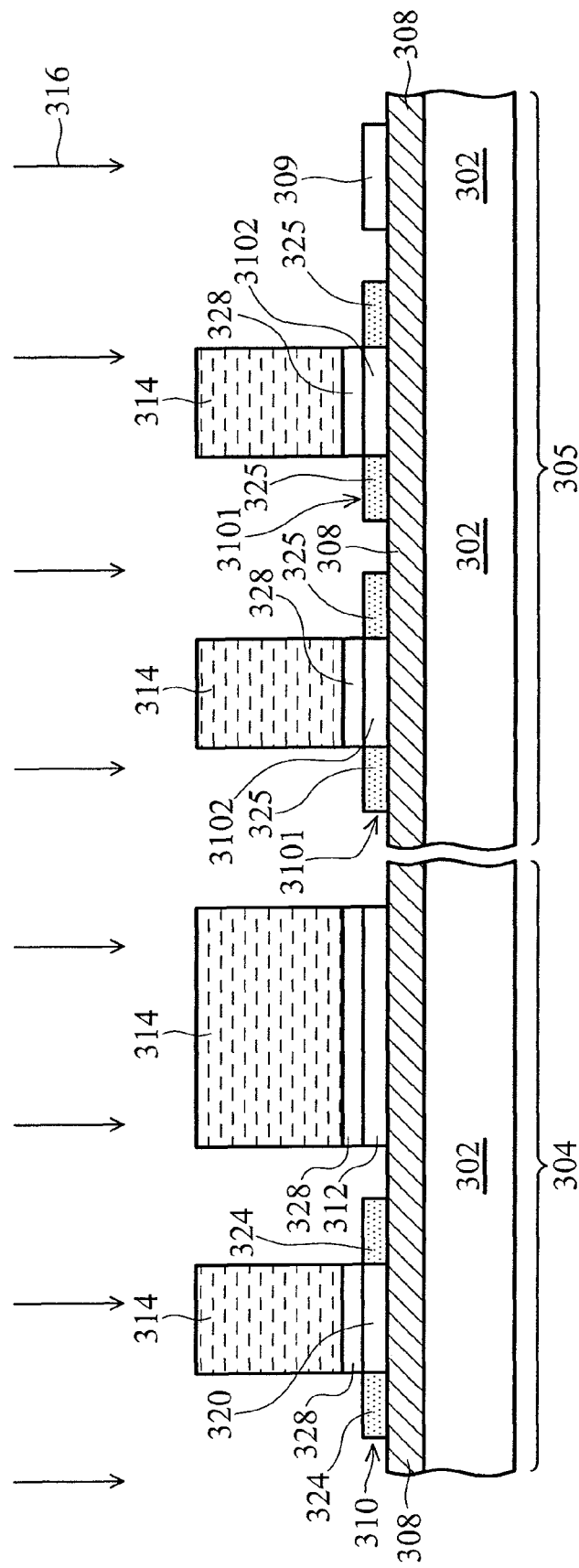

Referring to FIG. 6, ions 316 are implanted into the exposed active layer 310 and the exposed active layer 3101 to form a source/drain region 324, a source/drain region 325 respectively. A channel 320 interposed in the source/drain region 324 and a channel 3102 interposed in the source/drain region 325 are also formed. Alternatively, the implantation of ion 316 could have been performed before etching of the first dielectric layer 326, but after forming of the photoresist layer 314. In an embodiment of the invention, the ions 316 may comprise n+ ions such as phosphorous, and the dosage is preferably about 1E14~1E16 ions/cm$^2$. Meanwhile, ions 316 are implanted into the exposed bottom electrode 309 in the step of implantation of the source/drain region 324 and the source/drain region 325.

Figure 7:
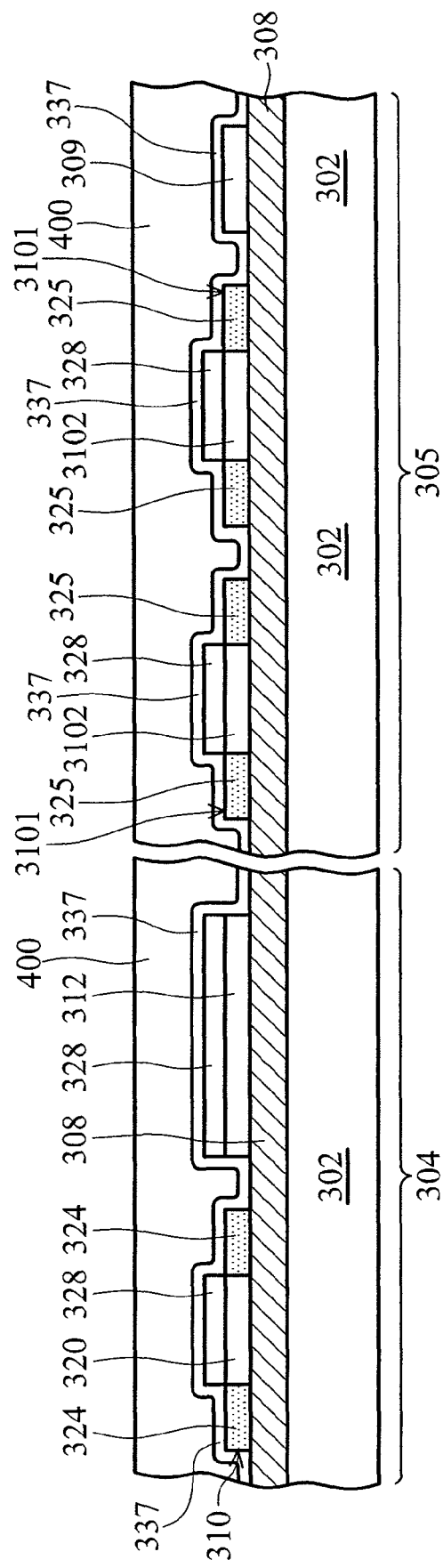

Referring to FIG. 7, the photoresist layer 314 is removed, and a second gate dielectric layer 337 is conformally formed over the substrate 302 in the driver area 304 and the pixel area 305. Specifically, the second gate dielectric layer 337 is conformally formed on the source/drain regions 324, 325, the first dielectric layer 328, the buffer layer 308, and the bottom electrode 309. The second dielectric layer 337 may comprises, for example, silicon oxide, silicon nitride, a combination thereof, a stack layer thereof, or other materials having a dielectric constant of about 8 or above. It is noted that the second dielectric layer 337 serves as a capacitor dielectric layer in a storage capacitor. In an embodiment, deposition of the second dielectric layer 337 may comprise CVD.

Referring to FIG. 7 again, a metal layer 400, is formed on the second gate dielectric layer 337. In one example, the metal layer 400 is about 1500 Å~2500 Å thick.

Figure 8:
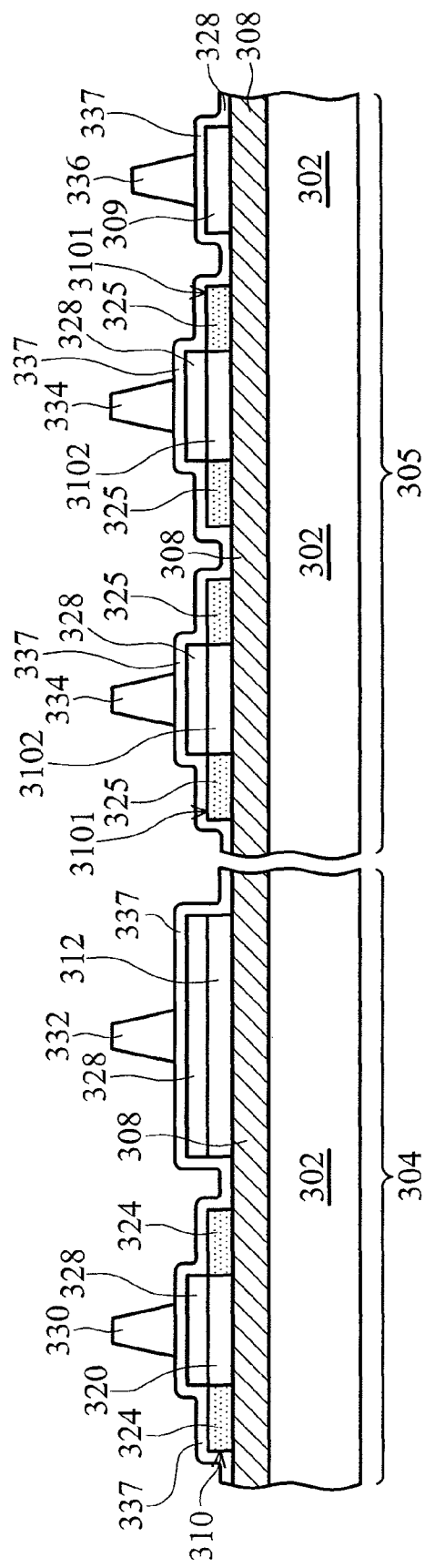

Referring to FIG. 8, the metal layer 400 is then patterned by conventional lithography and etching processes to form a gate 330, a gate 332, a gate 334 and a top electrode 336 overlying the active layer 310, the active layer 312, the active layer 3101 and the bottom electrode 309 respectively. Therefore, the source/drain region 325, the channel 3102, the first dielectric layer 328, the second dielectric layer 337 and the gate 334 constitute a transistor such an n-type transistor in the pixel area 305. It is noted that the first dielectric layer 328 and the second dielectric layer 337 are interposed between the gate 334 and the active layer 3101 and serve as the gate dielectric layer of the transistor in pixel area 305. Meanwhile, the bottom electrode 309 with ions, the second dielectric layer 337 serving as a capacitor dielectric layer, and the top electrode 336 constitute the storage capacitor 307 as shown in FIG. 8. The capacitor dielectric layer is relatively thinner than that of the gate dielectric layer. Also, the capacitor dielectric layer can be different from that of the gate dielectric layer. Alternately, the thinner portion of the first dielectric layer 328 as shown in FIG. 5B and the second dielectric layer 337 may be interposed between the bottom electrode 309 and the top electrode 336 as the capacitor dielectric layer.

The source/drain region 324, the channel 320, the first dielectric layer 328, the second dielectric layer 337 and the gate 330 constitute an n-type transistor in driver area 304. After a subsequent p-type source/drain process, the active layer 312 with p-type doped region (not shown), the first dielectric layer 328, the second dielectric layer 337 and the gate 332 constitute a p-type transistor in the driver area 304.

Figure 9:
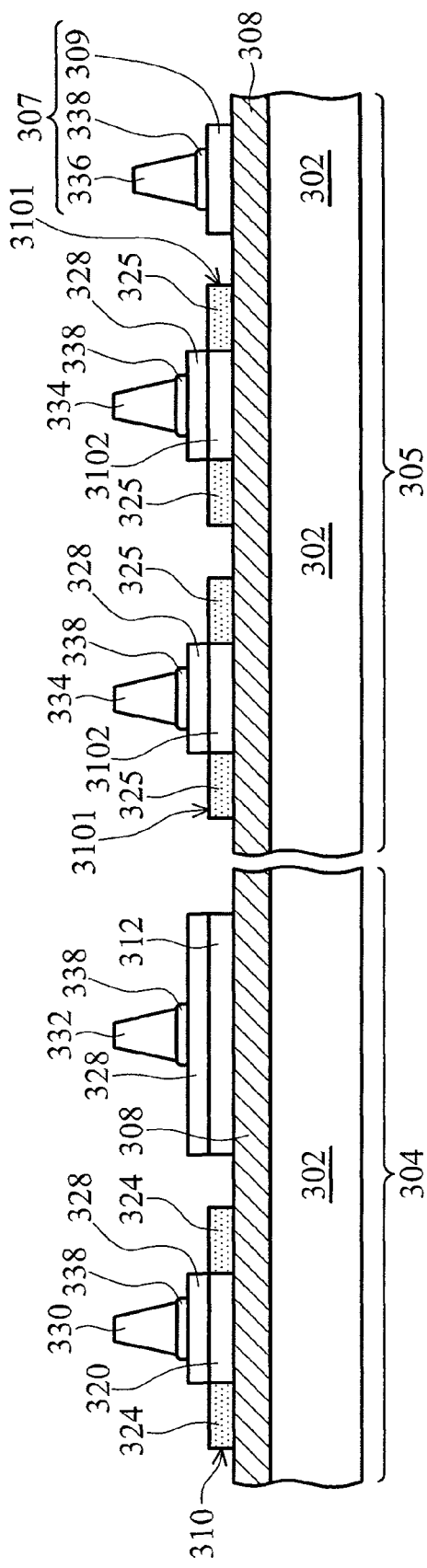

FIG. 9 shows an alternative cross section of a liquid crystal display device 200 of an embodiment of the invention. Continuing to FIG. 8 an etching process is optionally performed to remove a portion of the second dielectric layer 337 not covered by the gate 330, the gate 332, the gate 334 and the top electrode 336, and thus the patterned second dielectric layer 338 is formed. In this embodiment, the source/drain region 325, the channel 3102, the first dielectric layer 328, the patterned second dielectric layer 338 and the gate 334 constitute a transistor such an n-type transistor in the pixel area 305. It is noted that the first dielectric layer 328 and the patterned second dielectric layer 338 serve as the gate dielectric layer of the transistor in pixel area 305. Meanwhile, the bottom electrode 309 with ions, the patterned second dielectric layer 338 serving as a capacitor dielectric layer, and the top electrode 336 constitute the storage capacitor 307 as shown in FIG. 9.

The source/drain region 324, the channel 320, the first dielectric layer 328, the patterned second dielectric layer 338 and the gate 330 constitute an n-type transistor in the driver area 304. After a subsequent p-type source/drain process, the active layer 312 with p-type doped region (not shown), the first dielectric layer 328, the patterned second dielectric layer 338 and the gate 332 constitute a p-type transistor in the driver area 304.

The embodiments of the present invention have several advantages features. For example, the dielectric layer of the storage capacitor is thinner than that of gate dielectric layer without increasing mask count, thus a high capacitance value of the storage capacitor per unit area can be obtained. Accordingly, if a dielectric layer such as $Si_3N_4$ with a relatively larger dielectric constant is employed as a capacitor dielectric layer of the storage capacitor and the capacitance value of the storage capacitor is the same as the conventional one, the storage capacitor area can be reduced. In other words, an aperture ratio of the TFT-LCD can be increased.

Figure 10:
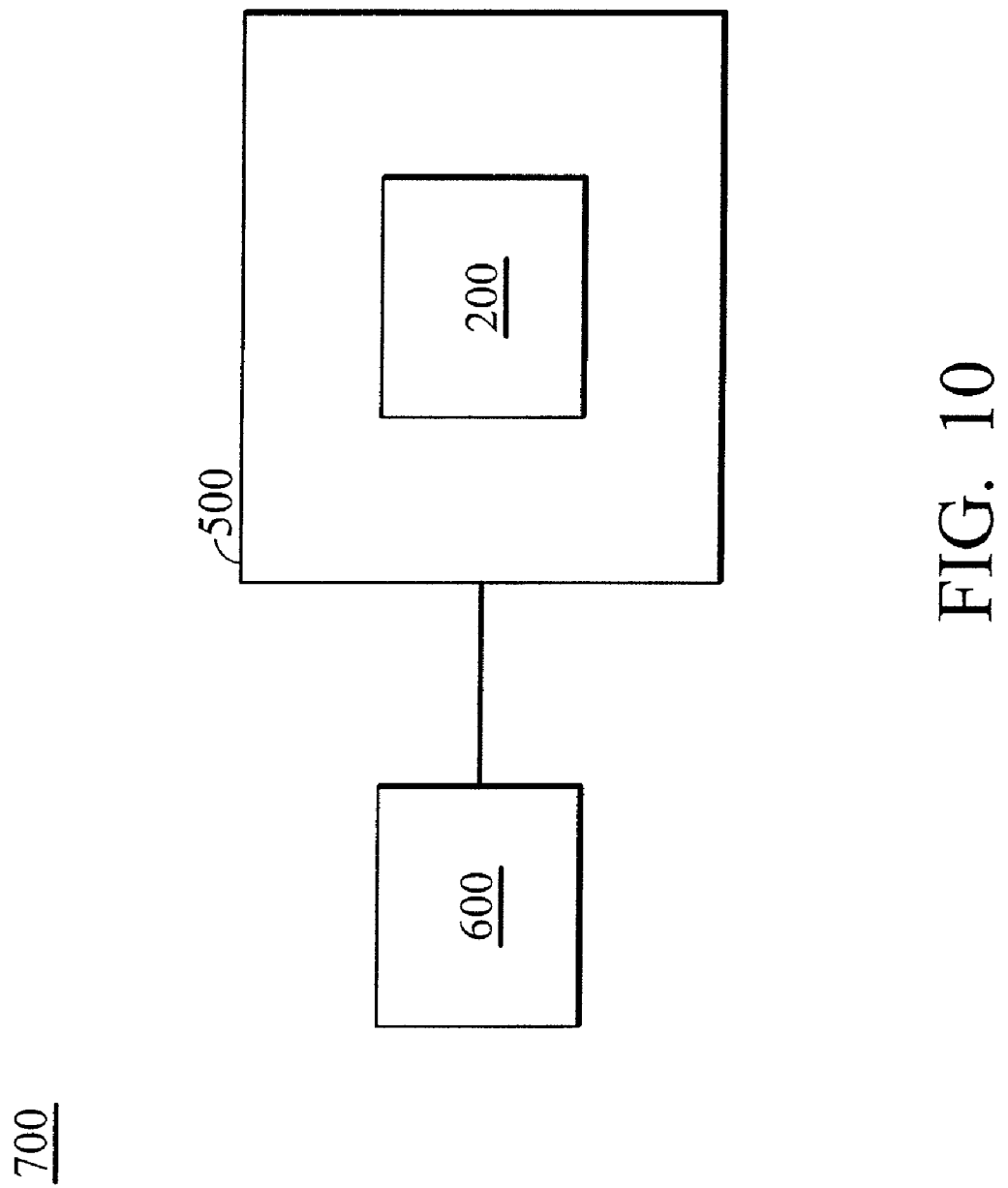
FIG. 10 schematically shows a system for displaying images including the TFT array substrate according to an embodiment of the invention.

FIG. 10 schematically shows an embodiment of a system for displaying images which, in this case, is implemented as a display panel 500 or an electronic device 700. The display device can be incorporated into a display panel 500. As shown in FIG. 10, the display panel 500 comprises a display device, such as the liquid crystal display device 200 shown in FIG. 9. The display panel 500 is applicable in a variety of electronic devices (in this case, electronic device 700).

Generally, the electronic device 700 can comprise the display panel 500 and an input unit 600. Further, the input unit 600 is operatively coupled to the display panel 500 and provides input signals (e.g., an image signal) to the display panel 500 to generate images. The electronic device 700 can be a mobile phone, digital camera, personal digital assistant (PDA), notebook computer, desktop computer, television, car display, portable DVD player, global positioning system, digital photo frame or avionics display, for example.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for display images, comprising:
   a thin film transistor array substrate, comprising:
      a substrate having a pixel area;
      a source/drain region overlying the substrate within an active layer in the pixel area;
      a bottom electrode overlying the substrate in the pixel area;
      a top electrode overlying the bottom electrode;
      a first dielectric layer disposed on the active layer;
      a second dielectric layer disposed on the first dielectric layer, wherein the second dielectric layer is disposed between the bottom electrode and the top electrode; and
      a gate disposed overlying the active layer, wherein the first and second dielectric layers are patterned dielectric layers and are interposed between the gate and the active layer,
      wherein the first dielectric layer has a thinner portion extending on the bottom electrode.

2. The system for display images as claimed in claim 1, further comprising a buffer layer on the substrate.

3. The system for display images as claimed in claim 1, wherein the active layer and the bottom electrode comprise polysilicon, the gate and the top electrode comprise metal.

4. The system for display images as claimed in claim 1, wherein the thinner portion has a thickness of about 150 Å to 250 Å.

5. The system for display images as claimed in claim 1, wherein the substrate further comprises a driver area having a p-type transistor and an n-type transistor.

6. The system for display images as claimed in claim 1, wherein the second dielectric layer is selected from the group consisting of silicon oxide, silicon nitride or a material having a dielectric constant greater than 8 or a combination thereof.

7. The system for display images as claimed in claim 1, further comprising a liquid crystal display device comprising the thin film transistor array substrate.

8. The system for display images as claimed in claim 7, further comprising an electronic device, wherein the electronic device comprises:
   the liquid crystal display device; and
   an input unit coupled to the liquid crystal display device to provide input to the liquid crystal display device such that the liquid crystal display device displays images.

9. The system for display images as claimed in claim 8, wherein the electronic device is a mobile phone, digital camera, personal digital assistant (PDA), notebook computer, desktop computer, television, car display, portable DVD player, global positioning system, digital photo frame or avionics display.

10. A method of forming a system for display images, comprising forming a thin film transistor array substrate, comprising the steps:
    providing a substrate having a pixel area;
    forming a semiconductor layer overlying the substrate in the pixel area;
    patterning the semiconductor layer to form an active layer and a bottom electrode in the pixel area;
    forming a first dielectric layer overlying the active layer and the bottom electrode;
    forming a mask layer overlying the first dielectric layer above the active layer;
    partially removing the first dielectric layer to expose the bottom electrode or leave a thinner portion of the first dielectric layer on the bottom electrode;
    implanting ions into the active layer to form a source/drain region;
    forming a second dielectric layer overlying the first dielectric layer and the bottom electrode;
    forming a metal layer overlying the second dielectric layer;
    patterning the metal layer to form a gate and a top electrode above the active layer and the bottom electrode respectively.

11. The method of forming a system for display images as claimed in claim 10, further comprising forming a buffer layer on the substrate.

12. The method of forming a system for display images as claimed in claim 10, wherein the active layer is exposed after the step of partially removing the first dielectric layer and a patterned first dielectric layer is formed.

13. The method of forming a system for display images as claimed in claim 10, wherein the ions are simultaneously implanted into the bottom electrode in the step of the ion implanting of the active layer.

14. The method of forming a system for display images as claimed in claim 10, further comprising partially removing the second dielectric layer not covered by the gate the top electrode.

15. The method of forming a system for display images as claimed in claim 10, wherein the substrate further comprises a driver area.

16. The method of forming a system for display images as claimed in claim 15, further comprising forming an n-type transistor and a p-type transistor in the driver area.

17. The method of forming a system for display images as claimed in claim 16, wherein the second dielectric layer is selected from the group consisting of silicon oxide, silicon nitride or a material having a dielectric constant greater than 8 or a combination thereof.

18. The method of forming a system for display images as claimed in claim 10, wherein the thinner portion of the first dielectric layer has a thickness of about 150 Å to 250 Å.

* * * * *